US012690147B2

(12) United States Patent
Kim et al.

(10) Patent No.: US 12,690,147 B2
(45) Date of Patent: Jul. 21, 2026

(54) DISPLAY DEVICE AND METHOD OF PROVIDING THE SAME

(71) Applicant: Samsung Display Co., Ltd., Yongin-si (KR)

(72) Inventors: Donghyeon Kim, Yongin-si (KR); In Soo Park, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 69 days.

(21) Appl. No.: 18/425,467

(22) Filed: Jan. 29, 2024

(65) Prior Publication Data

US 2024/0324122 A1      Sep. 26, 2024

(30) Foreign Application Priority Data

Mar. 22, 2023     (KR) ......................... 10-2023-0037580

(51) Int. Cl.
    *H05K 5/02*              (2006.01)
(52) U.S. Cl.
    CPC .................................. *H05K 5/0217* (2013.01)
(58) Field of Classification Search
    CPC ... H05K 5/0217; G06F 1/1624; G06F 1/1681; G06F 1/1652; G09F 9/301
    See application file for complete search history.

(56) References Cited

U.S. PATENT DOCUMENTS

| | | | |
|---|---|---|---|
| 9,465,473 B2 | 10/2016 | Lee et al. | |
| 10,880,417 B1 * | 12/2020 | Song .................. | H04M 1/0268 |
| 11,012,546 B1 * | 5/2021 | Song .................... | G06F 1/1656 |
| 11,460,888 B2 | 10/2022 | Cha et al. | |
| 2020/0008308 A1 * | 1/2020 | Shin ....................... | G09F 9/301 |
| 2022/0078270 A1 * | 3/2022 | Song .................. | H04M 1/0235 |
| 2022/0201880 A1 * | 6/2022 | Choi .................. | H05K 5/0217 |

FOREIGN PATENT DOCUMENTS

| | | |
|---|---|---|
| CN | 113947999 A | 1/2022 |
| KR | 102218649 B1 | 2/2021 |
| KR | 102393810 B1 | 5/2022 |

* cited by examiner

*Primary Examiner* — Sagar Shrestha
(74) *Attorney, Agent, or Firm* — CANTOR COLBURN LLP

(57)                ABSTRACT
A display device includes a display module, a lower substrate facing the display module and defining a plurality of openings in the lower substrate which are spaced apart from each other along a first direction, a plurality of support bars which are connected with the lower substrate and spaced apart from each other along the first direction, each of the plurality of support bars including a first portion extending in a second direction intersecting the first direction and including opposing ends in the second direction, and a plurality of second portions respectively extending from the opposing ends of the first portion, in a direction away from the lower substrate; and a housing from which and into which the display module is respectively extendible and retractable, along the first direction.

20 Claims, 12 Drawing Sheets

FIG. 7E

DISPLAY DEVICE AND METHOD OF PROVIDING THE SAME

This application claims priority to Korean Patent Application No. 10-2023-0037580, filed on Mar. 22, 2023, and all the benefits accruing therefrom under 35 U.S.C. § 119, the contents of which are hereby incorporated by reference in its entirety.

BACKGROUND

1. Field

The present disclosure relates to a display device including a plurality of support bars and a method of manufacturing (or providing) the display device.

2. Description of the Related Art

Electronic devices that provide an image to a user, such as a smartphone, a digital camera, a notebook computer, a navigation unit and a smart television, include a display device to display the image. The display device generates the image and provides the image to the user through a display screen of the display device.

With the technological development of the display device, various types of display devices are being developed. For example, various flexible display devices, which are slidable or rollable to be expanded to the outside of a housing, are being developed. The flexible display device that is capable of being transformed into various shapes is easy to carry and improves a user's convenience in using the flexible display device.

SUMMARY

A display device includes a display module. Multiple support plates are disposed under the display module of a flexible display device. When the flexible display device is slid, folded or bent, the support plates are separated by a pulling force.

The present disclosure provides a display device including a plurality of support bars.

The present disclosure provides a method of manufacturing (or providing) the display device.

Embodiments of the invention provide a display device including a display module, a lower substrate disposed under the display module and defining a plurality of opening groups spaced apart from each other in a first direction, a plurality of support bars combined with the lower substrate and spaced apart from each other in the first direction, and a housing from which and into which the display module is extendable and retractable, respectively. Each of the plurality of opening groups includes a plurality of openings defined through the lower substrate. Each of the plurality of support bars includes a first portion extending in a second direction intersecting the first direction, and a plurality of second portions respectively extending from one end and the other end of the first portion along a thickness direction of the lower substrate.

The display module and the lower substrate may bee slidable in or out of an inner space of the housing along the first direction.

The lower substrate may include a first side surface extending in the first direction, a second side surface extending from the first side surface along the second direction, a third side surface extending from the second side surface along a direction opposite to the first direction, and a fourth side surface connecting the first side surface and the third side surface and extending along the second direction, and a portion of the first side surface and a portion of the third side surface are rollable to allow a portion of the lower substrate, which includes the fourth side surface, to be slidable within the housing, along the first direction.

The portion of the first side surface and the portion of the third side surface may be provided with a plurality of grooves, and the plurality of grooves are spaced apart from each other in the first direction.

The plurality of grooves may respectively overlap the plurality of second portions of the plurality of support bars when viewed in a plane.

The plurality of grooves may have a depth equal to or smaller than half of a thickness of the lower substrate.

The plurality of support bars may be disposed between the plurality of opening groups when viewed in a plane.

Each of the plurality of support bars may have a width equal to or smaller than about 1 millimeter (mm) in the first direction.

A distance between one support bar of the plurality of support bars and an opening among the plurality of openings, which is adjacent to the plurality of support bar, may be equal to or greater than about 0.1 mm.

Embodiments of the invention provide a method of manufacturing (or providing) a display device. The method may include providing a lower substrate which faces a display module and includes a first side surface extending in a first direction, a second side surface extending from the first side surface along a second direction intersecting the first direction, a third side surface extending from the second side surface along a direction opposite to the first direction, and a fourth side surface connecting the first side surface and the third side surface and extending along the second direction, providing a plurality of support bars each including a first portion extending in the second direction and a plurality of second portions respectively extending from one end and the other end of the first portion along a thickness direction of the lower substrate, forming a plurality of grooves in a portion of the first side surface and a portion of the third side surface of the lower substrate, bonding the first portion of the plurality of support bars with the lower substrate, and bonding (such as by welding) the plurality of second portions of the plurality of support bars to the lower substrate.

The welding of the plurality of second portions of the plurality of support bars to the lower substrate may include partially melting the plurality of second portions of the plurality of support bars and allowing a melted portion to respectively overlap or extend into the plurality of grooves of the lower substrate and to combine the plurality of support bars with the lower substrate.

The method may further include removing (such as by grinding) a protruding portion formed (or provided) by the melted portion that is solidified and protruded further than an outer surface of the lower substrate.

The grinding of the protruding portion may include grinding the first side surface and the third side surface.

The grinding of the protruding portion may include grinding an upper surface of the lower substrate.

The method may further include combining the display module with an upper portion of the lower substrate.

Each of the plurality of grooves may have a depth equal to or smaller than half of a thickness of the lower substrate.

The lower substrate may include a plurality of opening groups arranged in the first direction, each of the plurality of opening groups includes a plurality of openings defined through the lower substrate and directly adjacent to each other along the first direction, and the plurality of support bars are disposed between the plurality of opening groups when viewed in a plane.

The bonding of the first portion of the plurality of support bars to the lower substrate may include attaching an adhesive member such as a tape to the first portion to bond the first portion to the lower substrate, and increasing a temperature of one or more of the lower substrate, the adhesive member and the plurality of support bars to thermally-bond the first portion of the plurality of support bars with the lower substrate.

According to the above, the support bars are bonded to a portion of the lower substrate that is partially etched to form a reduced-thickness portion of the lower substrate, and thus, an adhesive force between the lower substrate and the support bars is improved. In addition, as the lower substrate is partially etched, a variation in thickness caused by the bonding (e.g., welding) by-products is reduced. Thus, a quality of the display device provided by the manufacturing method of the display device is improved.

According to the above, the grooves are formed (or provided) by partially etching away a thickness portion the lower substrate, and thus, the bending of the lower substrate and changes in surface roughness of the lower substrate are reduced or prevented. In addition, as the grooves are formed with a uniform distance in the lower substrate relative to an area at which the openings are formed, tearing of portions of the lower substrate, which are adjacent to the openings, is prevented.

BRIEF DESCRIPTION OF THE DRAWINGS

The above and other advantages of the present disclosure will become readily apparent by reference to the following detailed description when considered in conjunction with the accompanying drawings where:

FIGS. 7A to 7E are views illustrating a method of manufacturing (or providing) a display device according to an embodiment of the present disclosure.

DETAILED DESCRIPTION

Figure 1A:
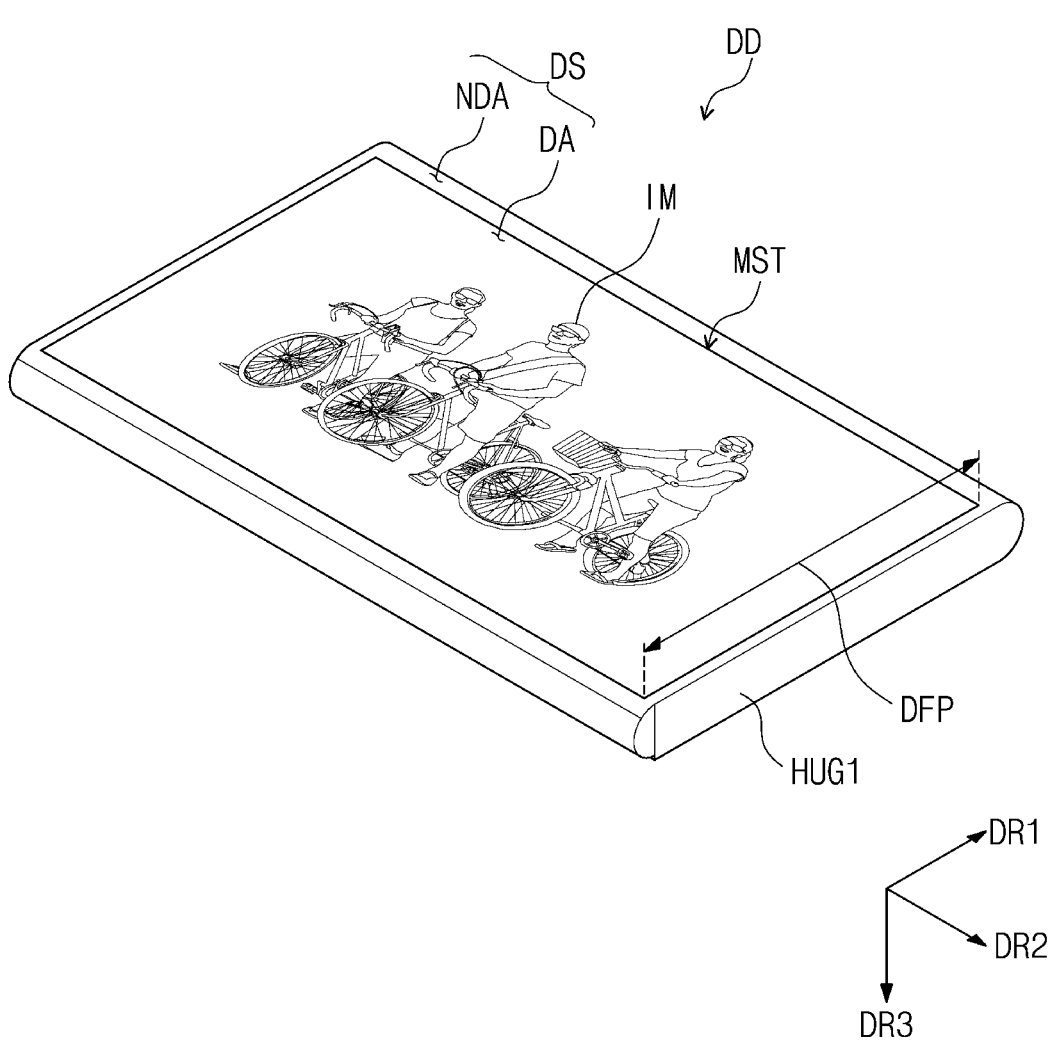
FIGS. 1A and 1B are perspective views of a display device according to an embodiment of the present disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In the present disclosure, it will be understood that when an element (or area, layer, or portion) is referred to as being related to another element such as being "on", "connected to" or "coupled to" another element or layer, it can be directly on, connected or coupled to the other element or layer or intervening elements or layers may be present. In contrast, when an element (or area, layer, or portion) is referred to as being related to another element such as being "directly on", "directly connected to" or "directly coupled to" another element or layer, no intervening element or layer is present.

Like numerals refer to like elements throughout. In the drawings, the thickness, ratio, and dimension of components are exaggerated for effective description of the technical content. Within the Figures and the text of the disclosure, a reference number indicating a singular form of an element may also be used to reference a plurality of the singular element.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" may include any and all combinations of one or more of the associated listed items. "At least one" is not to be construed as limiting "a" or "an." "Or" means "and/or." As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another elements or features as shown in the figures.

It will be further understood that the terms "include" and/or "including", when used in this specification, specify the presence of stated features, integers, steps, operations, elements, and/or components, but do not preclude the presence or addition of one or more other features, integers, steps, operations, elements, components, and/or groups thereof.

The term "part" or "unit" as used herein is intended to mean a software component or a hardware component that performs a specific function. The hardware component may include, for example, a field-programmable gate array (FPGA) or an application-specific integrated circuit (ASIC). The software component may refer to an executable code and/or data used by the executable code in an addressable storage medium. Thus, the software components may be, for example, object-oriented software components, class components, and task components, and may include processes, functions, attributes, procedures, subroutines, segments of program code, drivers, firmware, micro codes, circuits, data, a database, data structures, tables, arrays, or variables.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within +30%, 20%, 10% or 5% of the stated value.

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the present disclosure will be described with reference to accompanying drawings.

Figure 1B:
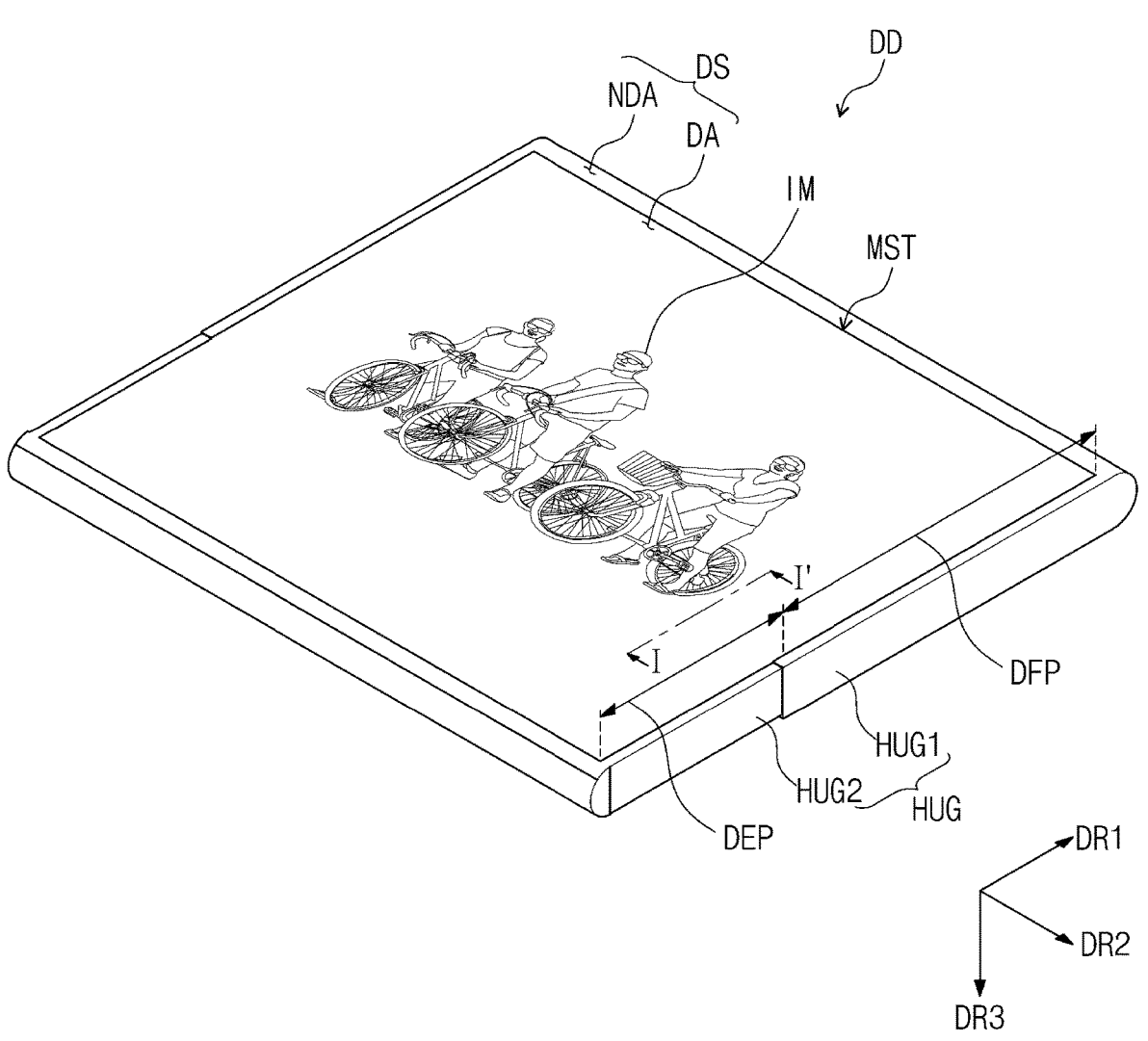

FIGS. 1A and 1B are perspective views of a display device DD according to an embodiment of the present disclosure. FIG. 1A shows the display device DD in a basic mode, and FIG. 1B shows the display device DD in an expansion mode.

The display device DD may be activated in response to electrical signals. Activation of the display device DD may display an image IM. As an example, the display device DD may be applied to a large-sized electronic item, such as a television set or an outdoor billboard. In addition, the display device DD may be applied to a small and medium-sized electronic item, such as a monitor, a mobile phone, a tablet computer, a navigation unit, and a game unit. However, these are merely examples, and the display device DD should not be particularly limited as long as not deviating from the concept of the present disclosure. In the present embodiment, the mobile phone will be described as a representative example of the display device DD.

The display device DD of the present embodiment may be flexible. The term "flexible" used herein refers to the property of being able to be bent (e.g., bendable) from a structure that is completely bent to a structure that is bent at the scale of a few nanometers. For example, the flexible display device DD may be a curved display device which is curvable, a foldable display device which is foldable, a slidable display device, or a rollable display device.

Referring to FIGS. 1A and 1B, an upper surface of the display device DD may be defined as (or may define) a display surface DS. The display surface DS may be disposed in or parallel to a plane defined by a first direction DR1 and a second direction DR2 crossing each other. The display device DD may display the image IM through the display surface DS toward a third direction DR3.

The image IM may include a video and a still image. FIGS. 1A and 1B show an image of a picture as a representative example of the image IM. The display surface DS through which the image IM is displayed may correspond to a front surface of the display device DD.

The display surface DS may include a display area DA and a non-display area NDA. The display area DA may display the image IM, and the non-display area NDA may not display the image IM. The non-display area NDA is adjacent to the display area DA. In an embodiment, the non-display area NDA may be defined around the display area DA, such as extending along one or more sides of the display area DA. In FIGS. 1A and 1B, the non-display area NDA surrounds the display area DA in a plan view (e.g., along the third direction DR3). However, the present disclosure should not be limited thereto or thereby.

The display device DD may have a quadrangular shape defined by short sides extending in the first direction DR1, and long sides extending in the second direction DR2 intersecting the first direction DR1. However, the planar shape of the display device DD should not be limited to the quadrangular shape, and the display device DD may have a variety of shapes, such as a rectangular shape, a square shape, a circular shape, a polygonal shape, or an irregular shape when viewed in a plane (e.g., along the third direction DR3).

The display device DD may include a housing HUG and a module set MST. The housing HUG may accommodate at least a portion of the module set MST at an inner are of the housing HUG. The housing HUG may include a first housing HUG1 and a second housing HUG2. The second housing HUG2 may be moveable relative to the first housing HUG1. The second housing HUG2 may move away from (e.g., extendable out of) or toward (e.g., retractable into) the first housing HUG1. As an example, the second housing HUG2 may move relative to the first housing HUG1, in a moving direction substantially parallel to the first direction DR1.

The module set MST may be retractable into and extendible out of the housing HUG, according to the movement of the second housing HUG2. That is, the module set MST may be moveable or slidable together with the second housing HUG2, to be respectively retractable into and extendible out of the first housing HUG1.

The module set MST may be accommodated in the housing HUG and may display the image IM. A portion of the module set MST may be slidable relative to the housing HUG, such as to be slid in or out of an inner space of the housing HUG, along a sliding direction parallel to the first direction DR1. The portion of the module set MST may be slidable together with the second housing HUG2, such as to be slid in or out of an inner space of the housing HUG, along the sliding direction parallel to the first direction DR1.

The module set MST may include one side (e.g., a first side) and another side (e.g., a second side) spaced apart from the one side, in (or along) the first direction DR1. The one side of the module set MST may be accommodated in the first housing HUG1, and the other side of the module set MST may be accommodated in the second housing HUG2. The module set MST accommodated in the housing HUG at the first side and the second side of the module set MST, includes an area (e.g., a planar area) which is exposed outside of the housing HUG. The planar area of the exposed area of the module set MST may be changeable owing to positions of the first housing HUG1 and the second housing HUG2 relative to each other along a sliding direction.

In the case where the second housing HUG2 moves along the sliding direction, in a direction away from the first housing HUG1, an exposed planar area of the module set MST may increase. Conversely, where the second housing HUG2 moves along the sliding direction in a direction toward the first housing HUG1, the exposed planar area of the module set MST may decrease. That is, the exposed area of the module set MST may be changed depending on the movement of the second housing HUG2 relative to other components of the housing HUG. The display device DD which has a minimally exposed planar area of the module set MST may include the second housing HUG2 maximally accommodated in the first housing HUG1. Conversely, the display device DD which has the maximally exposed planar area of the module set MST may include the second housing HUG2 minimally accommodated in the first housing HUG1.

Front (or upper) and rear (or lower) surfaces of each member of the display device DD may be opposite to each other in (or along) the third direction DR3, and a normal line direction relative to each of the front and rear surfaces may be substantially parallel to the third direction DR3. A separation distance between the front and rear surfaces of each member (or each unit) in the third direction DR3 may correspond to a thickness in the member (or the unit) in the third direction DR3 (e.g., a thickness direction). In the present disclosure, the expression "when viewed in a plane" may mean a state of being viewed in the third direction DR3. In the present disclosure, the expression "when viewed in a cross-section" may mean a state of being viewed in the first direction DR1 or the second direction DR2. Directions indicated by the first, second, and third directions DR1, DR2, and DR3 may be relative to each other, and thus, the directions indicated by the first, second, and third directions DR1, DR2, and DR3 may be changed to other directions.

Figure 2:
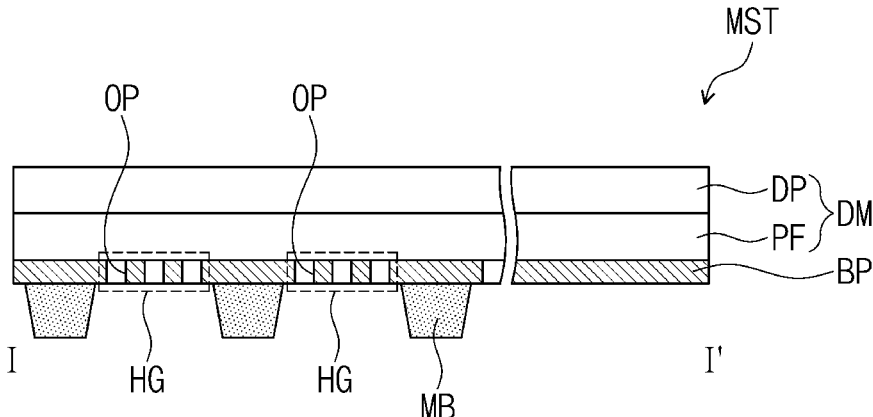
FIG. 2 is a cross-sectional view taken along line I-I' of FIG. 1B.
Figure 2:
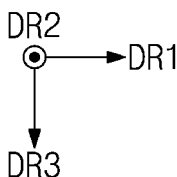

FIG. 2 is a cross-sectional view taken along line I-I' of FIG. 1B. FIG. 2 shows a cross-section of the module set MST.

Referring to FIG. 2, the module set MST may include a display module DM, a lower substrate BP, and a support bar MB provided in plural including a plurality of support bars MB. The support bars MB may be included in a support bar layer on the lower substrate BP. The display module DM may include a display panel DP and a lower protective film PF.

The display panel DP may display the image IM in response to the electrical signals. The display panel DP may generate the image IM. According to an embodiment, the display panel DP may be a light-emitting type display panel, however, it should not be particularly limited. For instance, the display panel DP may be an organic light emitting display panel, an inorganic light emitting display panel, an organic-inorganic light emitting display panel, or a quantum dot light emitting display panel. A light emitting layer of the organic light emitting display panel may include an organic light emitting material. A light emitting layer of the inorganic light emitting display panel may include an inorganic light emitting material. A light emitting layer of the organic-inorganic light emitting display panel may include an organic-inorganic light emitting material. A light emitting layer of the quantum dot light emitting display panel may include a quantum dot or a quantum rod. The display panel DP may be a flexible display panel which is bendable, rollable, curvable, foldable, etc.

The lower protective film PF may face the display panel DP and be disposed under the display panel DP. The lower protective film PF may be directly formed (or provided) on a lower portion of the display panel DP, or may be coupled with the display panel DP by an adhesive layer as an intervening layer. The lower protective film PF may protect the lower portion of the display panel DP. The lower protective film PF may include a flexible plastic material, such as polyethylene terephthalate (PET). The lower portion of the display panel DP may include a lower surface which is closest to the lower substrate BP along the thickness direction.

The lower substrate BP may be facing and disposed under the display module DM. The lower substrate BP may include a metal material. The lower substrate BP may also be referred to as a support plate BP. The lower substrate BP may support the display module DM and may protect the display module DM from external impacts. In addition, the lower substrate BP may prevent a foreign substance generated under the display module DM, from entering the display module DM.

The lower substrate BP may be provided with a plurality of opening groups HG defined therethrough and arranged in the first direction DR1. Each of the opening groups HG may include an opening OP provided in plural including a plurality of openings OP. The opening OP may extend completely through a thickness of the lower substrate BP, but is not limited thereto. Withing an opening group HG, the openings OP may be arranged in a lattice shape in the plan view. The lattice shape may include the openings OP separated by a solid portion of the lower substrate BP. As the lower substrate BP includes the opening groups HG, a flexibility of the lower substrate BP may be improved, and a folding stress generated when the display device DD is folded (or bent) may be reduced. The openings OP will be described in detail with reference to FIG. 5.

The support bars MB may be disposed under the lower substrate BP. The support bars MB may include a metal material. The support bars MB may be arranged in an area DEP that slides (hereinafter, referred to as an expansion area, refer to FIG. 3B). The support bars MB may guide a direction in which the display module DM and the lower substrate BP are expanded. The support bars MB may support the display module DM and the lower substrate BP to form a curvature. That is, the module set MST has a curvature at an expandable end thereof corresponding to the area DEP.

Each support bar MB among the plurality of support bars MB may extend in the second direction DR2, such as to have a major dimension along the second direction DR2. The support bars MB may be arranged spaced apart from each other in the first direction DR1. The support bars MB may be combined with the lower substrate BP by bonding or welding. In an embodiment, the support bars MB may be fixed to the lower substrate BP, and may be moveable together with the lower substrate BP. Herein, the lower substrate BP and/or the support bars MB may be considered a part of the display module DM. As used herein, a display may include the display panel DP, together with one or more of the lower protective film PF, the lower substrate BP and the support bar layer.

FIG. 2 shows the support bars MB each having a trapezoidal cross-sectional shape as a representative example, however, the shape of the support bars MB should not be limited thereto or thereby. The cross-sectional shape of the support bar MB may extend along a length direction of the support bar MB (e.g., along the second direction DR2).

The display device DD may further include a window (not shown) disposed on the display module DM. The window may protect the display panel DP from external scratches and impacts. The window may entirely cover an upper surface of the display module DM and may have a planar shape and/or cross-sectional profile corresponding to those of the display module DM. The window may include an optically transparent insulating material. The window may be a glass substrate or a polymer substrate. According to an embodiment, the window may be formed of a glass material. As an example, the window may be a glass substrate of which at least a portion is chemically tempered. The window may provide a front surface of the module set MST (or the display module DM) which is furthest from the support plate BP along the third direction DR3.

Figure 3A:
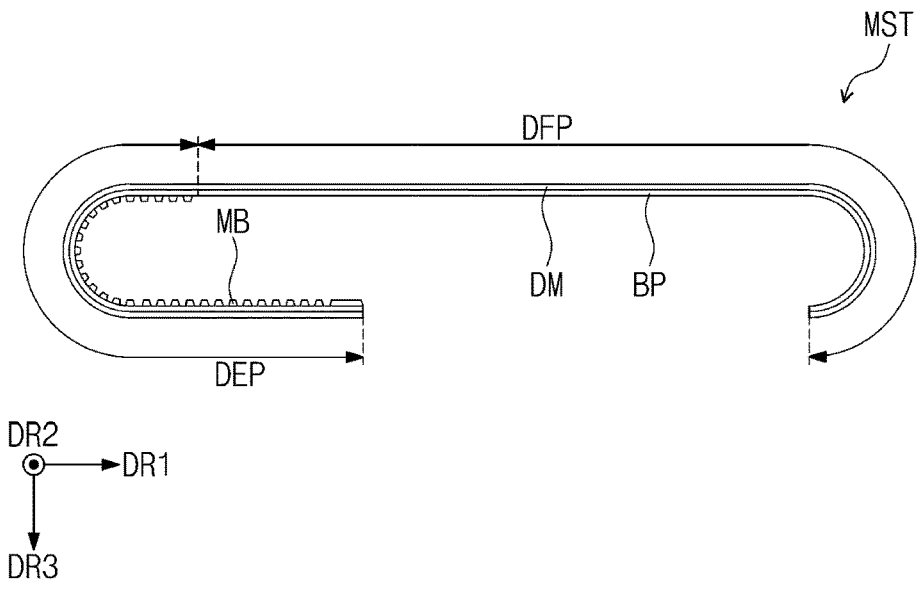
FIGS. 3A and 3B are cross-sectional views illustrating a sliding operation of a module set according to an embodiment of the present disclosure.
Figure 3B:
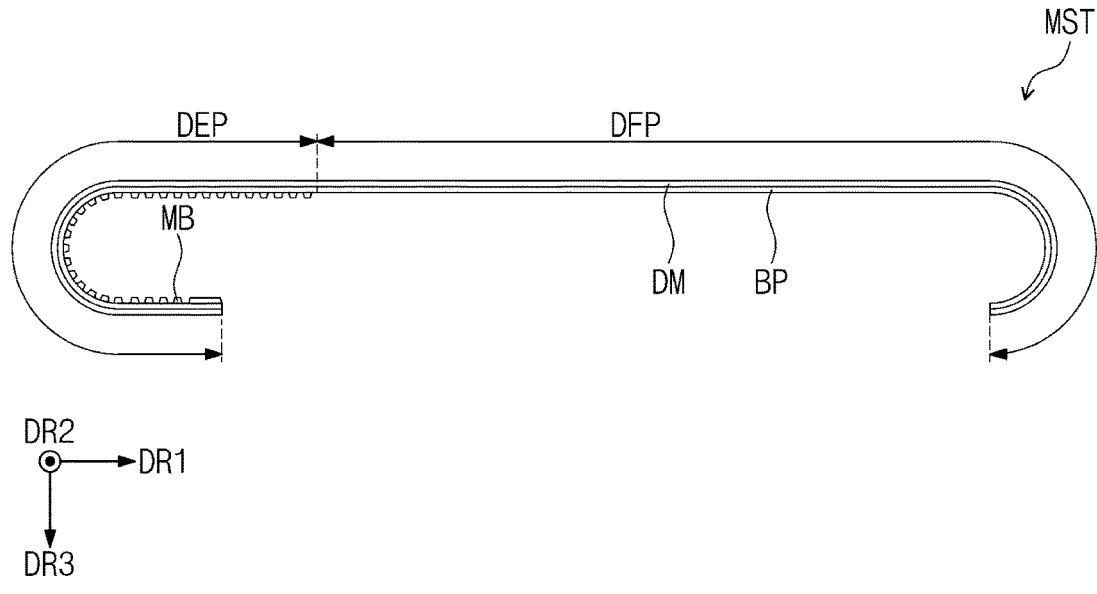

FIGS. 3A and 3B are cross-sectional views illustrating a sliding operation of the module set MST according to an embodiment of the present disclosure. FIG. 3A is a cross-sectional view of the basic mode of the display device DD of FIG. 1A, and FIG. 3B is a cross-sectional view of the expansion mode of the display device DD of FIG. 1B. The display device DD may be minimally expanded in the basic mode, while being partially or completely (maximally) expanded in the expansion mode, without being limited thereto. Portions of the housing HUG are omitted from the views of FIGS. 3A and 3B for convenience of illustration.

Referring to FIGS. 3A and 3B, the display module DM may include a fixed area DFP and the expansion area DEP. A boundary may be defined between the fixed area DFP and the expansion area DEP. The support bar layer may be disposed in and define the expansion area DEP. Referring back to FIGS. 1B and 2, the support bar layer may be disposed within the second housing HUG2, while the fixed area DFP extending from the expansion area DEP is closer to the first housing HUG1 than the second housing HUG2.

The fixed area DFP of the display module DM may be defined as an area (e.g., a planar area) for which the length along the sliding direction and/or planar shape is not changed even though the sliding operation is carried out (e.g., the module set MST is slid relative to the housing HUG). The expansion area DEP of the display module DM may be defined as an area (e.g., a planar area) for which the length along the sliding direction and/or planar shape is changed due to the sliding operation. The respective planar areas of the fixed area DFP and the expansion area DEP may be those planar areas defined in the DR1-DR2 plane. The respective planar areas may together define a visible display area and/or a visible display surface of the display device DD at which the image IM is viewable from outside of the display device DD.

When the display device DD is in the basic mode (FIG. 3A), a plane of the display module DM, which is defined by the first direction DR1 and the second direction DR2, may include the fixed area DFP (e.g., a fixed planar area). In this case, the expansion area DEP (e.g., an expandable planar area) may extend from the fixed area DFP to be curvedly bent to face a rear surface of the display module DM. In an embodiment of the basic mode, the DR1-DR2 plane of the display module DM may include the fixed planar area and a first planar area of the expandable planar area. The first planar area of the expansion area DEP may be coplanar with the fixed planar area.

When the display device DD is in the expansion mode (FIG. 3B), the plane of the display module DM, which is defined by the first direction DR1 and the second direction DR2, may include the fixed area DFP and the expansion area DEP. In this case, a portion of the expansion area DEP may be exposed to a direction to which a front surface of the display module DM is exposed (e.g., in a direction opposite to the third direction DR3), and a remaining portion of the expansion area DEP may be curved and/or bent toward the rear surface of the display module DM in one or more direction to which the front surface of the display module DM is not exposed (e.g., a lateral direction, a downward direction, etc.). In an embodiment of the expansion mode, the DR1-DR2 plane of the display module DM may include the fixed planar area and a second planar area of the expandable planar area which is larger than the first planar area. The second planar area of the expansion area DEP may be coplanar with the fixed planar area.

The portion of the display module DM at the expansion area DEP which is bent to the rear surface of the display module DM in the expansion mode, may be smaller than the portion of the display module DM at the expansion area DEP which is bent to the rear surface of the display module DM in the basic mode. The portion of the display module DM which is bent may be a length portion of the display module DM along the first direction DR1, except for a length portion which is coplanar with the fixed planar area. The bent portion of the display module DM respectively excludes the first planar area in the basic mode and the second planar area in the expansion mode. The respective lengths along the first direction DR1 of the bent portions of the display module DM in FIGS. 3A and 3B represent the bent portion in FIG. 3A being larger than the bent portion in FIG. 3B. That is, the respective lengths of the bent portions of the display module DM in FIGS. 3A and 3B represent an exposed (planar) area of the display module DM in FIG. 3B which is larger than the exposed (planar area) of the display module DM in FIG. 3A. Such coplanar areas along the DR1-DR2 plane may together define a visible display area and/or a visible display surface of the display device DD at which the image IM is viewable from outside of the display device DD.

The shortening of the length of the bent portion of the display module DM from the basic mode (FIG. 3A) to the extended mode (FIG. 3B) may be achieved by extension of the second housing HUG2 out of the first housing HUG1, along the sliding direction (state of FIG. 1A to state of FIG. 1B). Referring to the layered structure in FIGS. 3A and 3B which includes the display module DM together with the lower substrate BP and the support bar layer, although not explicitly shown, the extendible end of the layered structure (e.g., left end) may be connected to the second housing HUG2 such that extension of the second housing HUG2 out of the first housing HUG1 in the sliding direction (state of FIG. 1A to state of FIG. 1B), effects the left end of the layered structure to be moved in the sliding direction (state of FIG. 3A to state of FIG. 3B) to thereby increase the front surface area (e.g., the first planar area to the second planar area) of the expansion area DEP. In an embodiment, for example, at least the distal end of the expansion area DEP is slidable relative to the housing HUG along the first direction DR1, to lengthen or shorter the bent portion of the display module DM and the lower substrate BP. That is, distal ends of the display module DM and the lower substrate BP may be slidable together with each other, relative to the housing HUG.

Figure 4:
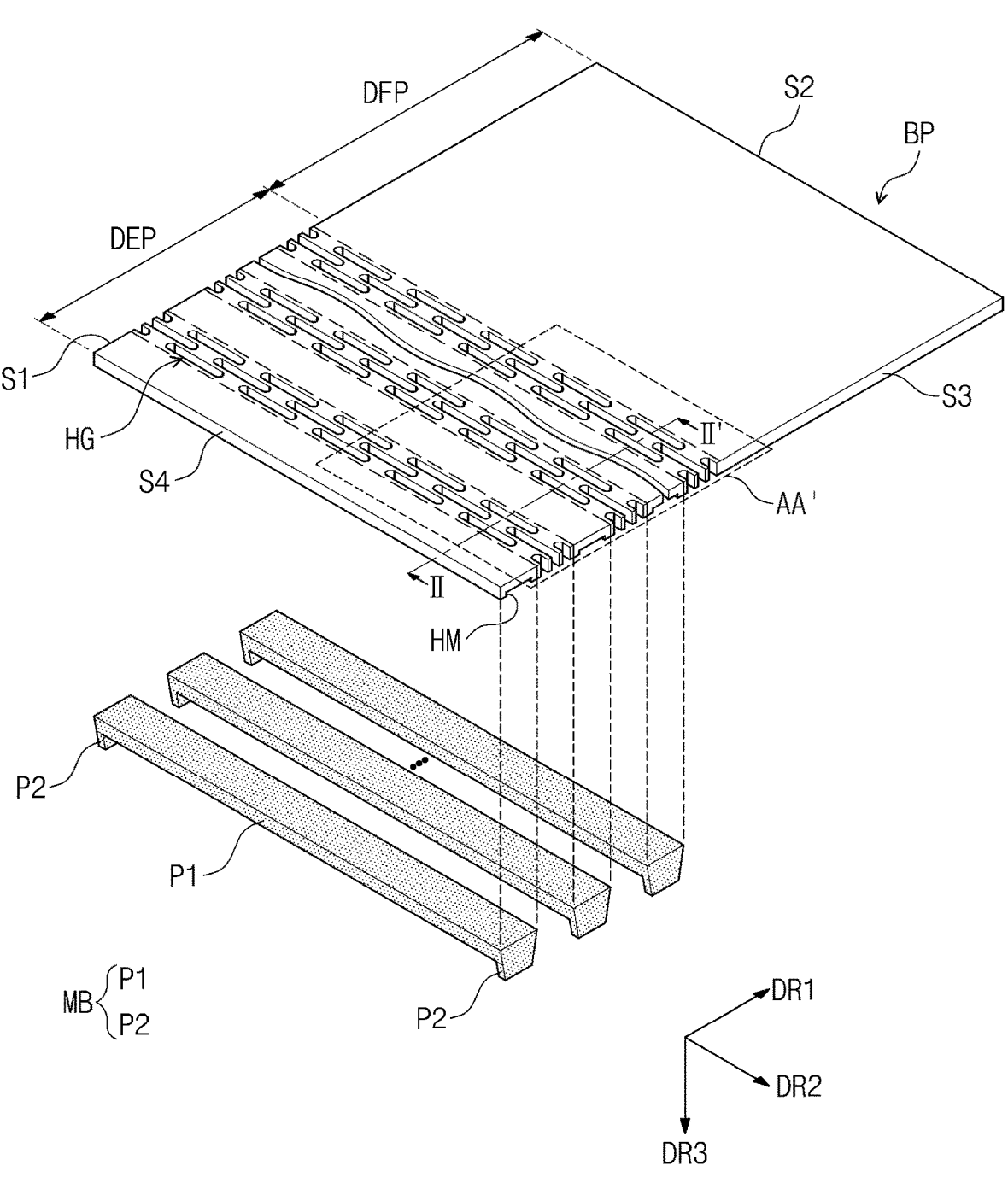
FIG. 4 is an exploded perspective view of a lower substrate and a plurality of support bars according to an embodiment of the present disclosure.

Referring to FIG. 4 together with FIGS. 3A and 3B, the fourth side surface S4 is closest to the plurality of support bars MB, along the first direction DR1. An end portion of the first side surface S1 and an end portion of the third side surface S3 are bendable (e.g., left ends in FIGS. 3A and 3B). Since distal ends of the display module DM and the lower substrate BP may be slidable together with each other, relative to the housing HUG, transitioning between the basic and extended modes includes bending of the end portions of the first side surface S1 and the second side surface S2 which slides the fourth side surface S4 (extended into the views of FIGS. 3A and 3B) along the housing HUG.

FIGS. 3A and 3B show thirty-one support bars MB each having a trapezoidal shape as a representative example, however, the shape and number of the support bars MB should not be limited thereto or thereby. The number of the support bars MB may vary depending on a size of the display device DD (refer to FIG. 1A) and a size (e.g., a length along the first direction DR1) of the expansion area DEP.

FIG. 4 is an exploded perspective view of the lower substrate BP and the support bars MB according to an embodiment of the present disclosure.

Referring to FIG. 4, each of the support bars MB may extend in the second direction DR2. Each of the support bars MB may include a first portion P1 and a plurality of second portions P2 which extend from the first portion P1. The first portion P1 may have opposing ends along the second direction DR2 which include a first end and a second end. The first portion P1 of the support bars MB may extend in the second direction DR2, and the second portions P2 may respectively extend from one end (e.g., a first end) and the other end (e.g., the second end) of the first portion P1, in a thickness direction of the lower substrate BP, e.g., the third direction DR3.

The lower substrate BP may include a first side surface S1, a second side surface S2, a third side surface S3, and a fourth side surface S4. The first side surface S1 may extend in the first direction DR1, and the second side surface S2 may extend from the first side surface S1 along the second direction DR2. The third side surface S3 may extend from the second side surface S2 along a direction opposite to the first direction DR1, and the fourth side surface S4 may connect the first side surface S1 and the third side surface S3 and may extend in the second direction DR2. The first side surface S1 and the third side surface S3 may face each other, and the second side surface S2 and the fourth side surface S4 may face each other. That is, the lower substrate BP may have a quadrangular shape including the first, second, third, and fourth side surfaces S1, S2, S3, and S4.

A portion of the first side surface S1 and a portion of the third side surface S3, which are adjacent to (e.g., closest to) the fourth side surface S4, may correspond to or define the expansion area DEP. The portion of the first side surface S1 and the portion of the third side surface S3 may be rollable, and thus, a portion of the lower substrate BP which is at the expansion area DEP may be rolled. As an example, the first side surface S1 and the third side surface S3, which overlap the expansion area DEP, may be rollable, and the portion of the lower substrate BP, which includes the fourth side surface S4, may be rolled.

A plurality of grooves HM may be defined in or by the support plate BP, at the portion of the first side surface S1 and the portion of the third side surface S3. The grooves HM may be defined in the first side surface S1 and the third side surface S3, which overlap the expansion area DEP. The groove HM may be open along the second direction DR2, at each of the first side surface S1 and the third side surface S3, in addition to being open in the third direction DR3. The groove HM may be recessed from a bottom surface of the support plate BP to be open in the third direction DR3. The groove HM may have a width along the second direction DR2 from a respective side surface at which the groove HM is open to outside the support plate BP. Referring to FIG. 4, at the end portion of the first side surface S1 or the second side surface S2 which is closest to the fourth side surface S4, the lower substrate BP further defines a plurality of grooves HM spaced apart from each other along the first direction DR1 and respectively facing the plurality of support bars MB.

The grooves HM may be spaced apart from each other along the direction in which the lower substrate BP is rolled (e.g., a rolling direction). As an example, the grooves HM may be spaced apart from each other in the first direction DR1. The grooves HM may overlap (or correspond to) the second portions P2 of the support bars MB when viewed in the plane. When the support bars MB are combined with the lower substrate BP, the support bars MB may be coupled to overlap the grooves HM. In an embodiment of a method of providing the display device DD, a material portion of the support bars MB which is melted such as during a welding process, may fill the grooves HM of the lower substrate BP. In FIG. 4, the melted material portion of the support bar MB filled in the grooves HM is omitted for convenience of illustration.

Figure 5:
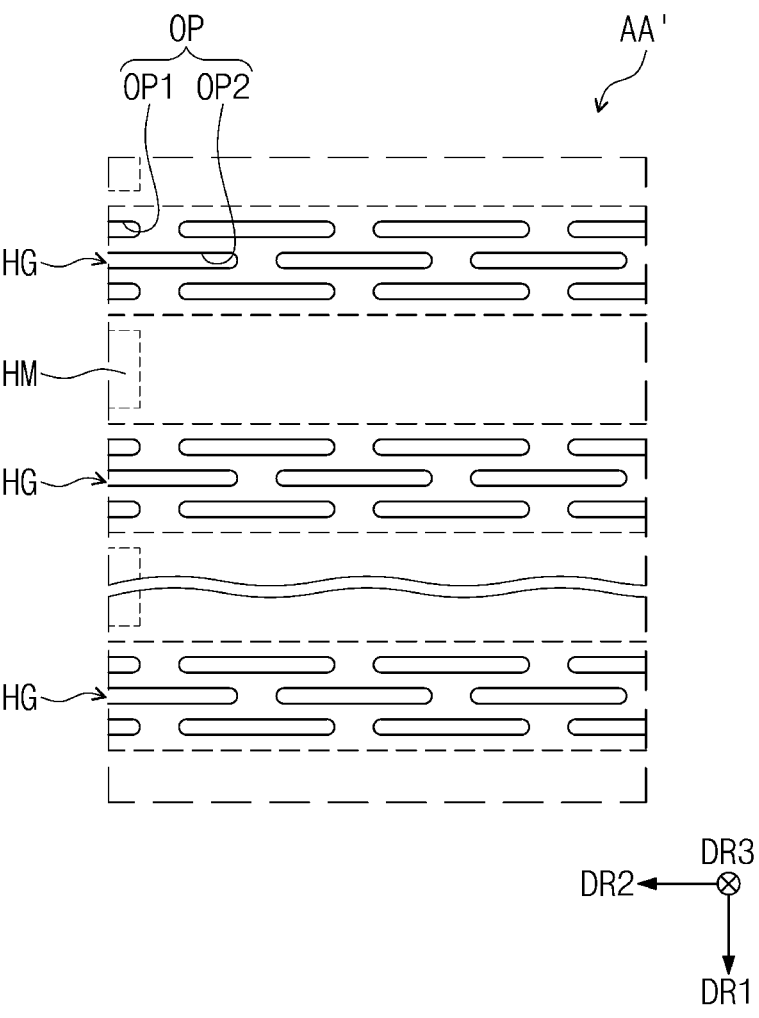
FIG. 5 is an enlarged view of an area AA' of FIG. 4.

FIG. 5 is an enlarged view of area AA' of FIG. 4.

Referring to FIGS. 4 and 5, the support bars MB may be disposed between the opening groups HG of the lower substrate BP along the first direction DR1, when viewed in the plane. The support bars MB may alternate with the opening groups HG of the lower substrate BP along the first direction DR1. That is, the support bars MB may not overlap the opening groups HG when viewed in the plane. As not overlapping, elements may be adjacent to each other or spaced apart from each other along a plane.

Each of the opening groups HG may be provided with a group of the openings OP. Each of the opening groups HG may include first openings OP1 and second openings OP2. The first openings OP1 may each have a length which extends in the second direction DR2. The first openings OP1 may be spaced apart from each other in the second direction DR2. The second openings OP2 may each have a length which extends in the second direction DR2. The second openings OP2 may be spaced apart from each other in the second direction DR2. The first openings OP1 may be alternately arranged with the second openings OP2, along the first direction DR1, within an opening group HG.

Each of the openings OP may have a center along the length direction, e.g., the second direction DR2. As an example, a center of each of the first openings OP1 may not overlap the second openings OP2 along the first direction DR1, and a center of each of the second openings OP2 may not overlap the first openings OP1 along the first direction DR1. That is, centers of openings adjacent along the first direction DR1 are staggered to be non-overlapping with each other.

Figure 6:
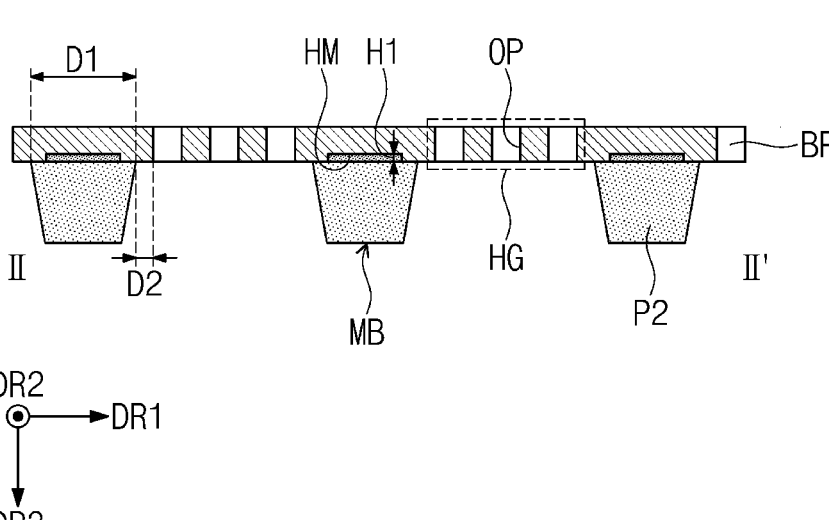
FIG. 6 is a cross-sectional view taken along line II-II' of FIG. 4.

FIG. 6 is a cross-sectional view taken along line II-II' of FIG. 4.

Referring to FIGS. 4 and 6, the grooves HM of the lower substrate BP may have a depth H1 equal to or smaller than a half of a thickness of the lower substrate BP. As an example, the depth H1 of the grooves HM of the lower substrate BP may be a half to one-third ($\frac{1}{2}$ to $\frac{1}{3}$) of the thickness of the lower substrate BP.

A maximum width D1 in the first direction DR1 of the second portion P2 of the support bars MB may be equal to or smaller than about 1 millimeter (mm). As an example, a width in the first direction DR1 of the support bars MB may be equal to or greater than about 0.6 mm and equal to or smaller than about 0.9 mm. The maximum width D1 may be defined at an interface of the support plate BP with a protruded portion of the support bar MB which is outside of the support plate BP.

A distance D2 between one support bar MB of the support bars MB and the opening OP which is adjacent (or closest) to the support bar MB among the openings OP, may be equal to or greater than about 0.1 mm. That is, along the first direction DR1, a solid portion of the support plate BP which corresponds to the support bar MB, extends further than support bar MB by the distance D2. A length of the groove HM along the first direction DR1 may be smaller than the maximum width D1. An edge of the groove HM may be spaced apart from a corresponding edge of the support bar MB, along the first direction DR1. Accordingly, a distance between a groove HM overlapping the support bar MB and the opening OP which is adjacent to the groove HM may be equal to or greater than about 0.1 mm. As the grooves HM are formed with a uniform distance in the lower substrate BP through which the openings OP are formed, tearing of the solid portions of the lower substrate BP which are adjacent to the openings OP (or the opening groups HG), may be prevented.

FIGS. 7A to 7E are views illustrating a method of manufacturing (or providing) the display device DD according to an embodiment of the present disclosure. In FIGS. 7A to 7E, the same/similar reference numerals denote the same/similar elements in FIGS. 1 to 6, and thus, detailed descriptions of the same/similar elements will be omitted.

The method of providing the display device DD may include providing each of the lower substrate BP including the first side surface S1 extending in the first direction DR1, the second side surface S2 extending from the first side surface S1 to the second direction DR2 intersecting the first direction DR1, the third side surface S3 extending from the second side surface S2 to the direction opposite to the first direction DR1, and the fourth side surface S4 connecting the first side surface S1 and the third side surface S3 and extending in the second direction DR2, providing the support bars MB including the first portion P1 extending in the second direction DR2 intersecting the first direction DR1 and the second portions P2 respectively extending from the opposing ends of the first portion P1 along the thickness direction of the lower substrate BP, forming (or providing) the grooves HM in the lower substrate BP at the portion of the first side surface S1 and the portion of the third side surface S3 of the lower substrate BP, bonding the first portions P1 of the support bars MB to the lower substrate BP, and welding the second portions P2 of the support bars MB to the lower substrate BP.

Figure 7A:
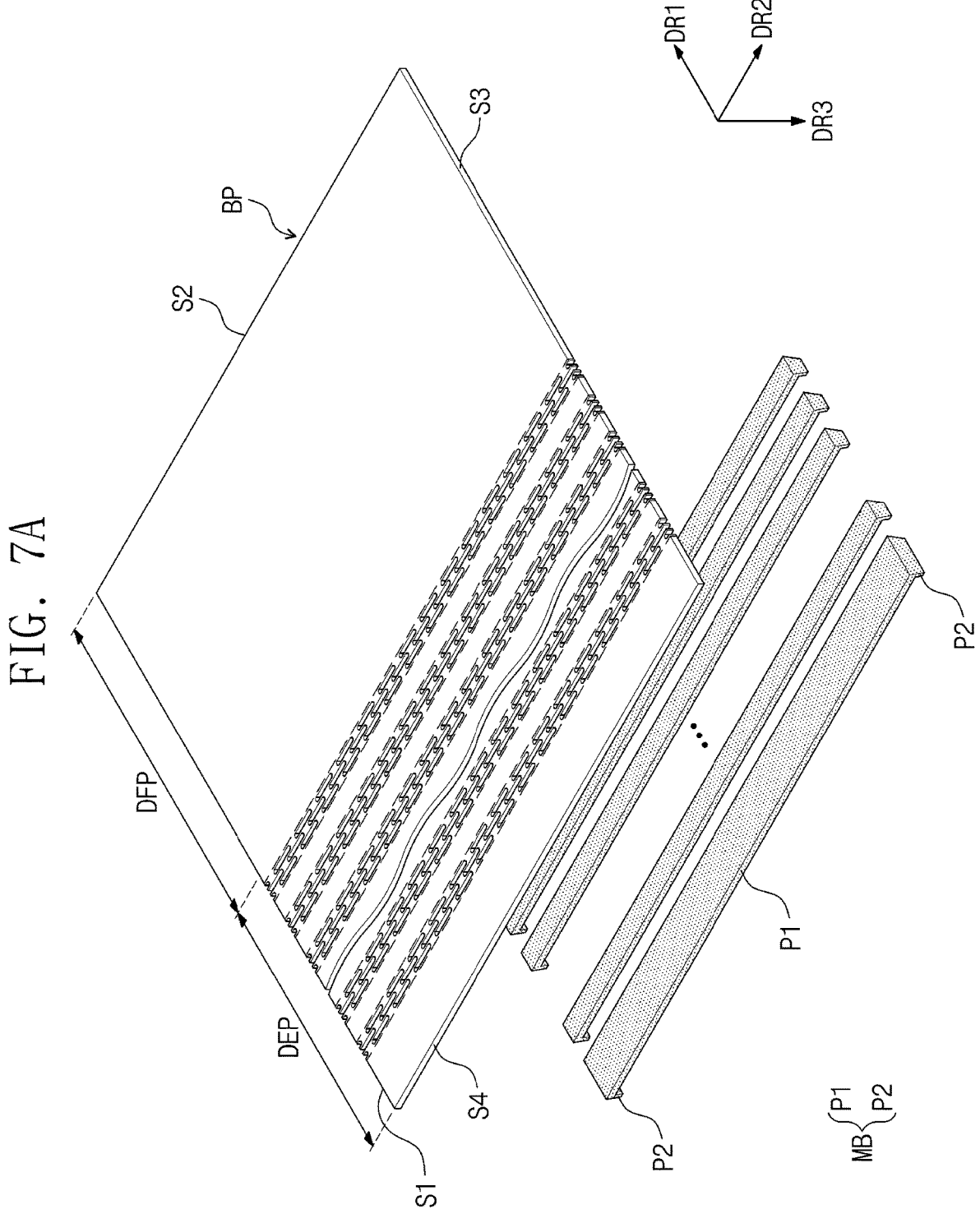

Referring to FIG. 7A, the method of providing the display device DD may include the providing of the lower substrate BP and the providing of the support bars MB facing a lower surface of the lower substrate BP.

The lower substrate BP may include the first side surface S1, the second side surface S2, the third side surface S3, and the fourth side surface S4. The first side surface S1 may extend in the first direction DR1, and the second side surface S2 may extend from the first side surface S1 along the second direction DR2. The third side surface S3 may extend from the second side surface S2 along the direction opposite to the first direction DR1, and the fourth side surface S4 may connect the first side surface S1 and the third side surface S3 and may extend along the second direction DR2. The first side surface S1 and the third side surface S3 may face (or be opposite to) each other, and the second side surface S2 and the fourth side surface S4 may face each other. That is, the lower substrate BP may have the quadrangular shape defined by the first, second, third, and fourth side surfaces S1, S2, S3, and S4.

A preliminary lower substrate BP shown in FIG. 7A may exclude the grooves HM at solid portions of the preliminary lower substrate BP which are respectively between the opening groups HG along the first direction DR1. The un-grooved end portions of the preliminary lower substrate BP respectively correspond to the support bars MB. That is, the un-grooved end portions of the preliminary lower substrate BP respectively correspond to the grooves HM at which the support bars MB are coupled to the lower substrate BP.

Each of the support bars MB may include the first portion P1 and the second portions P2 which extend from the first portion P1. The first portion P1 of the support bars MB may extend in the second direction DR2, and the second portions P2 may respectively extend from opposing ends of the first portion P1 along the thickness direction, e.g., the third direction DR3, in a direction away from the lower substrate BP. Among the support bars MB, the support bar MB disposed at an outermost position of the expansion area DEP and furthest from the expansion area DEP, may have a width in the first direction DR1 which is greater than widths of the other remaining support bars MB, however, this is merely an example. According to an embodiment, all of the support bars MB arranged along the first direction DR1 may have substantially the same width in the first direction DR1.

Figure 7B:
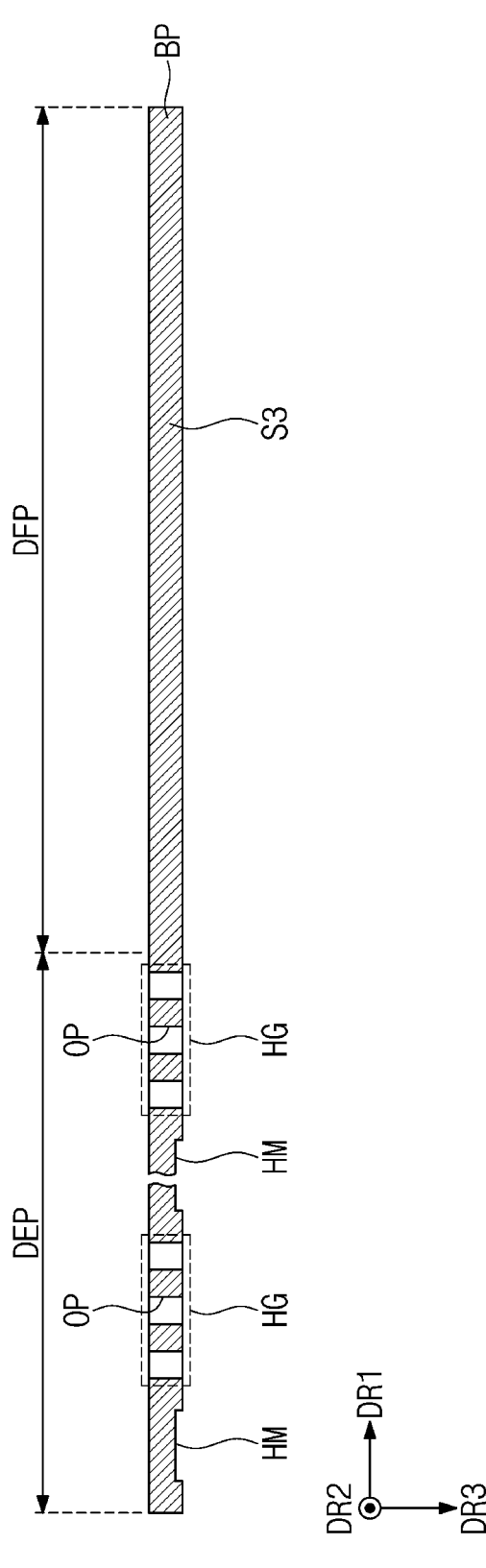

Referring to FIG. 7B, the method of providing the display device DD may include the forming (or providing) of the grooves HM in the lower substrate BP. End portions of the lower substrate BP at the first side surface S1 and the third side surface S3 of the lower substrate BP may be etched to define etched portions along a respective side surface. The grooves HM may be respectively defined by the etched portions.

The portions of the first side surface S1 and the third side surface S3 of the lower substrate BP may be etched by a half to one-third ($\frac{1}{2}$ to $\frac{1}{3}$) of a total or maximum thickness of the lower substrate BP. That is, a depth H1 of the grooves HM of the lower substrate BP may be equal to or smaller than the half of the thickness of the lower substrate BP. As an example, the depth H1 of the grooves HM of the lower substrate BP may correspond to a half to one-third ($\frac{1}{2}$ to $\frac{1}{3}$) of the thickness of the lower substrate BP. Referring to FIGS. 5 and 6, together with FIG. 7B, the grooves HM having the depth H1 and a width along the first direction DR1, may be recessed from the respective side surface at a distance along the second direction DR2.

The grooves HM may be formed between opening groups HG adjacent to each other. When viewed in the plane, the grooves HM may not overlap the opening groups HG. The grooves HM may be defined recessed from the first side surface S1 and the third side surface S3, at side surface portions of the lower substrate BP which overlap the expansion area DEP. The grooves HM may be spaced apart from each other in the direction to which the lower substrate BP is rolled. As an example, the grooves HM may be spaced apart from each other in the first direction DR1. As the grooves HM are formed by partially etching the lower substrate BP, the bending of the lower substrate BP may be reduced or prevented, and changes in surface roughness may be reduced or prevented.

FIG. 7B shows the grooves HM relative to the third side surface S3 of the lower substrate BP as a representative example, however, processes described with reference to FIG. 7B may be applied to the first side surface S1 of the lower substrate BP.

Figure 7C:
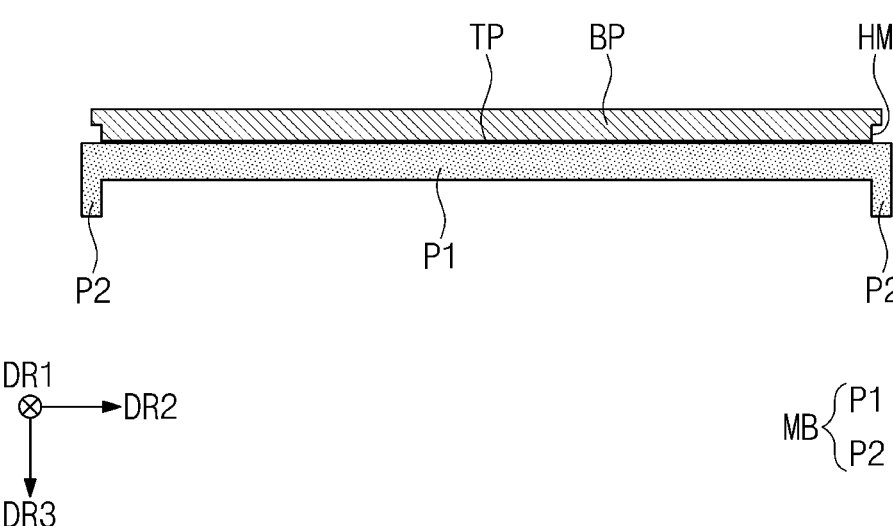

Referring to FIGS. 4 and 7C, the method of providing the display device DD may include bonding of the first portion P1 of the support bars MB to the lower substrate BP. The bonding of the support bars MB at the first portion P1 thereof, to the lower substrate BP, may be otherwise referred to as a preliminary bonding or a first bonding. The bonding of the first portion P1 of the support bars MB to the lower substrate BP may include attaching a tape TP to the first portion P1 to bond the first portion P1 to the lower substrate BP and increasing a temperature to thermally-bond the first portion P1 of the support bars MB and the lower substrate BP.

The support bars MB may have an upper surface closest to the lower substrate BP. The tape TP may be attached to the upper surface at the first portion P1 of the support bars MB. The tape TP may be a thermal-bonding tape, however, this is merely an example. At the upper surface of the first portion P1, the first portion may be contacted and bonded with the lower substrate BP at a lower surface thereof. The first portion P1 of the support bars MB may be thermally-bonded to the lower substrate BP by increasing the temperature of the support bars MB and the lower substrate BP. As an example, a temperature in a chamber where the first bonding process of the support bars MB and the lower substrate BP is carried out may be increased to increase the temperatures of the support bars MB and the lower substrate BP.

The lower substrate BP may include the opening groups HG spaced apart from each other in the first direction DR1. Each of the opening groups HG may include a respective group of the openings OP (refer to FIG. 5). The support bars MB may be disposed under the lower substrate BP, at solid portions of the lower substrate BP respectively between the opening groups HG. The support bars MB may be disposed between the opening groups HG when viewed in the plane. That is, the support bars MB may not overlap the opening groups HG when viewed in the plane. The grooves HM may be defined at etched ends of the solid portions, to be open in both the second direction DR2 and the direction which is opposite to the second direction DR2.

Figure 7D:
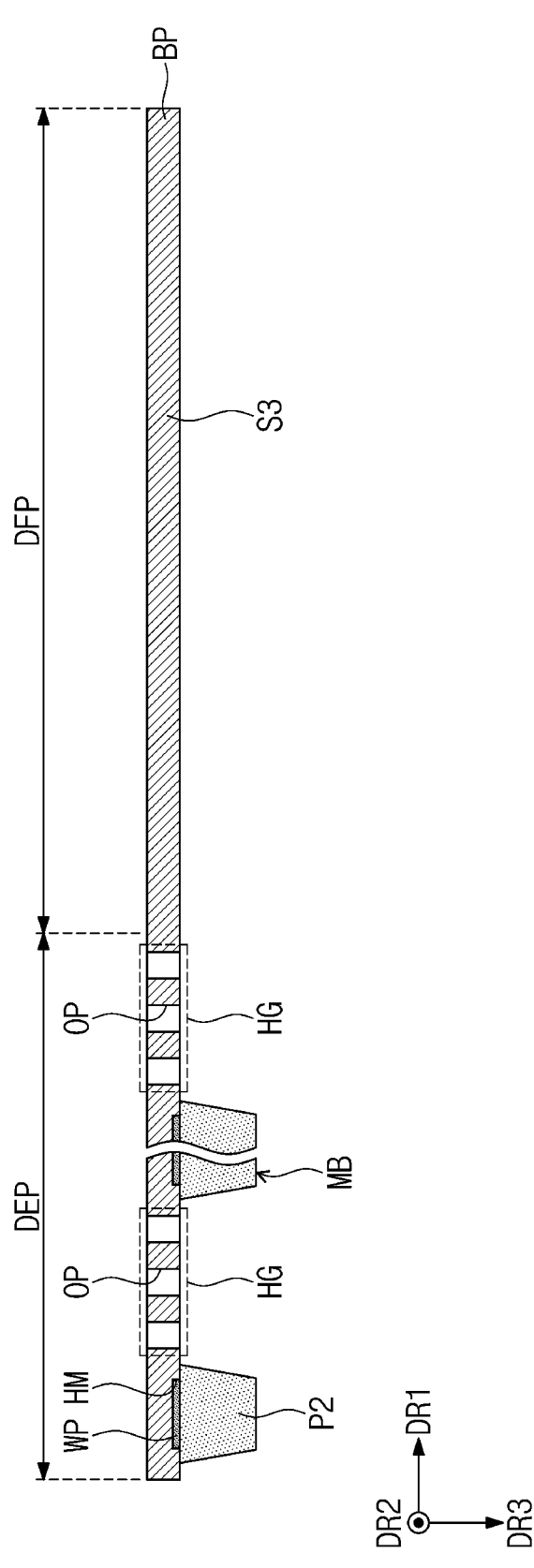

Referring to FIGS. 4 and 7D, the method of providing the display device DD may include second bonding of the support bars MB to the lower substrate BP. The bonding of the support bars MB to the lower substrate BP may include welding of the support bars MB at the second portions P2 thereof, to the lower substrate BP. The welding of the second portions P2 of the support bars MB to the lower substrate BP may include partially melting the second portions P2 of the support bars MB and combining the support bars MB with the lower substrate BP to allow the melted portion WP to overlap the grooves HM of the lower substrate BP. For example, the support bars MB are combined with the lower substrate BP by extending the melted portion WP connected to a remainder of the support bars MB, into the grooves HM of the lower substrate BP and contacting the lower substrate BP at the grooves HM. As being in contact, elements may form an interface therebetween.

The material of the support bars MB at the second portions P2 of the support bars MB may be partially melted. The melted portion WP in a liquid state may overlap and extend into the grooves HM of the lower substrate BP, such that the melted portion WP may fill the grooves HM which remaining connected to the remainder of the support bars MB. When the melted portion WP filled in the grooves HM is solidified, the support bars MB may be combined with the lower substrate BP, however, the present disclosure should not be limited thereto or thereby. According to an embodiment, the support bars MB may be combined with the lower substrate BP by melting a separate metal material other than the support bars MB and the lower substrate BP.

As the width in the first direction DR1 of the support bars MB increases, a force applied to the opposing ends of the support bars MB, e.g., at the second portion P2, may increase. According to the present disclosure, as the partially-etched lower substrate BP is welded to the support bars MB at the opposing ends thereof, an adhesive force between the lower substrate BP and the ends of the support bars MB may be improved. In addition, as the lower substrate BP is partially etched, a variation in thickness of the lower substrate BP and the support bars MB, which is caused by the welding by-products, may be reduced. Accordingly, a quality of the display device DD (refer to FIG. 1A) provided by one or more embodiment of the method of providing the display device DD may be improved.

Figure 7E:
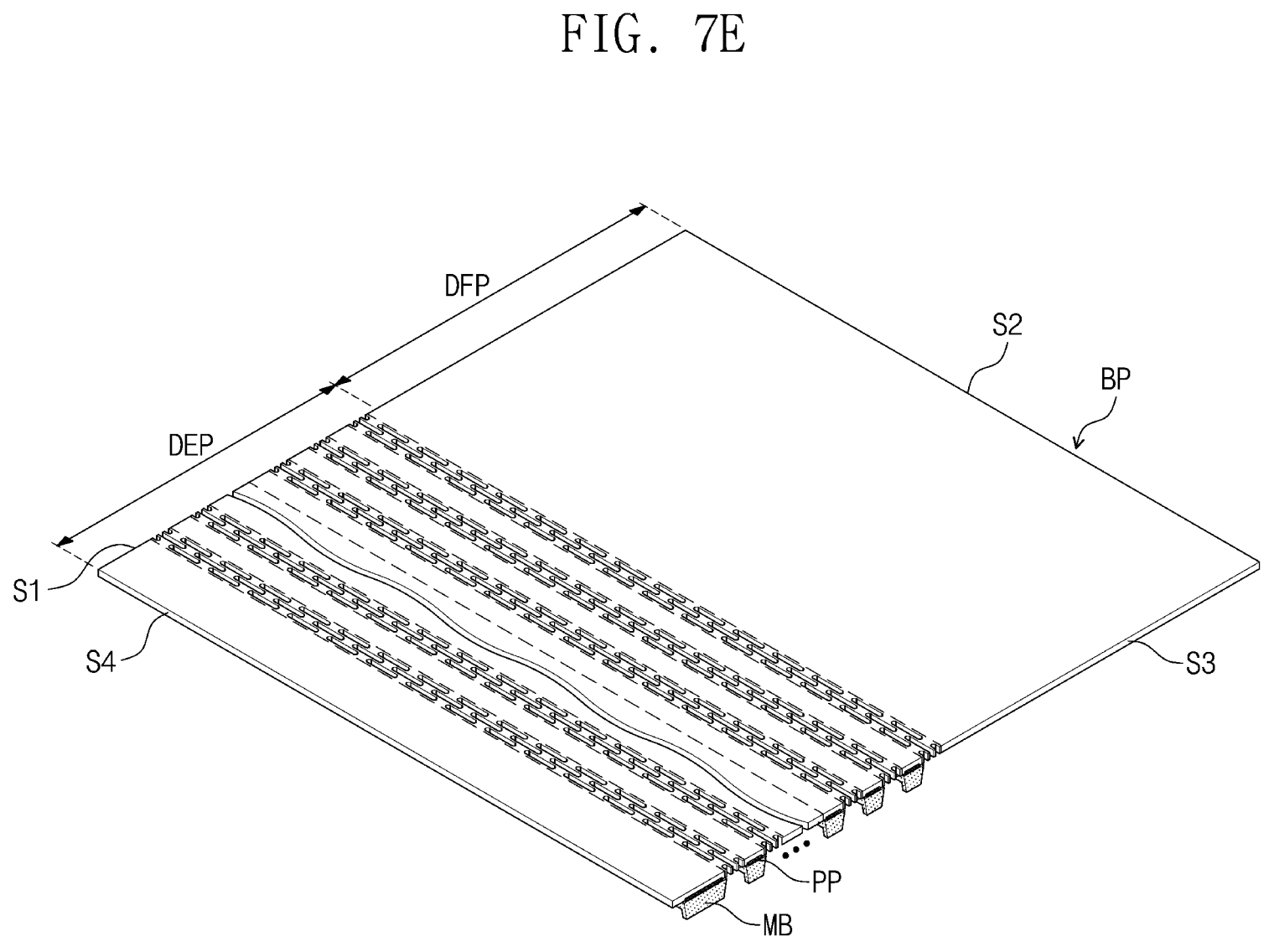

Referring to FIGS. 4 and 7E, the method of providing the display device DD may include removing a protruding portion PP that is formed when the melted portion WP (refer to FIG. 7D) is solidified and protruded from the lower substrate BP. In the process of solidifying the melted portion WP (refer to FIG. 7D), the protruding portion PP may be formed. The protruding portion PP may protrude from a respective side surface among the first side surface S1 and the third side surface S3 of the lower substrate BP, along the second direction DR2, where the various side surfaces of the lower substrate BP define an outer surface thereof. That is, the method may include removing a protruding portion PP of a respective melted portion which extends further than an outer surface of the lower substrate BP.

The protruding portion PP may further protrude along the third direction DR3, such as further than the upper surface of the lower substrate BP which is opposite to the lower surface thereof, where the upper and lower surfaces may define an outer surface of the lower substrate BP. In an embodiment, the protruding portion PP may be a portion of the melted portion WP which extends out of the groove HM and further than the respective side surface of the lower substrate BP, along the second direction DR2.

The removal of the protruding portion PP may include grinding the assembled structure of FIG. 7E, at the first side surface S1 and the third side surface S3 of the lower substrate BP. In addition, removal of the protruding portion PP may further include grinding the assembled structure at the upper surface of the lower substrate BP. The removal process applied to the protruding portion PP may be a chemical etching process or may be a physical grinding process. In this case, for ease of grinding, a width in the second direction DR2 of the lower substrate BP may be formed smaller than a width in the second direction DR2 of the support bars MB.

The method of providing the display device DD may include combining the display module DM (refer to FIG. 2) with an upper portion of the lower substrate BP having support bars MB coupled thereto at a lower portion of the lower substrate BP. In an embodiment, the coupled structure of FIG. 7E may be combined with the display module DM, to provide the module set MST of FIG. 2.

Although embodiments of the present disclosure have been described, it is understood that the present disclosure should not be limited to these embodiments but various changes and modifications can be made by one ordinary skilled in the art within the spirit and scope of the present disclosure as hereinafter claimed. Therefore, the disclosed subject matter should not be limited to any single embodiment described herein, and the scope of the present invention shall be determined according to the attached claims.

What is claimed is:

1. A display device comprising:
a display module;
a lower substrate facing the display module and defining a plurality of openings in the lower substrate which are spaced apart from each other along a first direction;
a plurality of support bars which are connected with the lower substrate and spaced apart from each other along the first direction, each of the plurality of support bars comprising:
a first portion extending in a second direction intersecting the first direction and including opposing ends in the second direction, and
a plurality of second portions respectively extending from the opposing ends of the first portion, in a direction away from the lower substrate,
wherein each of the plurality of the support bars is bonded to the lower substrate at the plurality of second portions.

2. The display device of claim 1, further comprising a housing from which and into which the display module is respectively extendible and retractable, along the first direction, wherein the display module and the lower substrate are slidable out from and into the housing, together with each other, along the first direction.

3. The display device of claim 2, wherein the lower substrate comprises:

a first side surface extending in the first direction, a second side surface extending from the first side surface along the second direction, a third side surface extending from the second side surface along a direction opposite to the first direction, and a fourth side surface connecting the first side surface and the third side surface and extending along the second direction, the fourth side surface being closest to the plurality of support bars, along the first direction, and an end portion of the first side surface and an end portion of the third side surface which are closest to the fourth side surface and are bendable, wherein bending of the end portions of the first and third side surfaces slides the fourth side surface along the first direction.

4. The display device of claim 3, wherein at the end portion of the first side surface or the third side surface, the lower substrate further defines a plurality of grooves spaced apart from each other along the first direction and respectively facing the plurality of support bars, and at the plurality of second portions, each of the plurality of the support bars is bonded to the lower substrate at the plurality of grooves.

5. The display device of claim 4, wherein each of the plurality of grooves has a depth equal to or smaller than half of a thickness of the lower substrate.

6. The display device of claim 1, wherein the lower substrate further defines a plurality of grooves spaced apart from each other along the first direction and respectively overlapping the plurality of second portions of the plurality of support bars, and at the plurality of second portions, each of the plurality of the support bars is bonded to the lower substrate at the plurality of grooves.

7. The display device of claim 1, wherein along the first direction, the plurality of support bars alternate with the plurality of openings.

8. The display device of claim 1, wherein within the lower substrate:

a group of openings among the plurality of openings includes openings which are directly adjacent to each other along the first direction, and the group of openings is provided in plural including a plurality of opening groups, and along the first direction, the plurality of support bars alternate with the plurality of opening groups.

9. The display device of claim 1, wherein along the first direction, each of the plurality of support bars has a width equal to or smaller than about 1 millimeter.

10. The display device of claim 1, wherein along the first direction, a distance between a support bar among the plurality of support bars and an opening among the plurality of openings which is closest to the support bar, is equal to or greater than about 0.1 millimeter.

11. A method of providing a display device, comprising:

providing a lower substrate which faces a display module of the display device, the lower substrate comprising a first side surface extending in a first direction, a second side surface extending from the first side surface along a second direction intersecting the first direction, a third side surface extending from the second side surface along a direction opposite to the first direction, and a fourth side surface connecting the first side surface and the third side surface and extending along the second direction;

providing a plurality of support bars facing the lower substrate and closer to the fourth side surface than the second side surface, each of the plurality of support bars comprising:

a first portion extending in the second direction and including opposing ends in the second direction, and a plurality of second portions respectively extending from the opposing ends, in a direction away from the lower substrate;

providing a plurality of grooves in the lower substrate which are spaced apart from each other along the first direction and respectively facing the plurality of second portions of the plurality of support bars; and respectively bonding the plurality of second portions of the plurality of support bars to the lower substrate, at the plurality of grooves.

12. The method of claim 11, wherein the bonding of the plurality of second portions of the plurality of support bars to the lower substrate comprises:

partially melting the plurality of second portions of the plurality of support bars; and allowing a melted portion to overlap the plurality of grooves of the lower substrate and to combine the plurality of support bars with the lower substrate.

13. The method of claim 12, further comprising removing a protruding portion of a respective melted portion which extends further than an outer surface of the lower substrate.

14. The method of claim 13, wherein the removing of the protruding portion comprises removing melted portions which extend further than the first side surface and the third side surface of the lower substrate, along the second direction, respectively.

15. The method of claim 13, wherein the lower substrate further comprises an upper surface which is closest to the display module, and the removing of the protruding portion comprises removing respective melted portions which extend further than the upper surface of the lower substrate.

16. The method of claim 11, wherein the lower substrate further comprises an upper surface which is closest to the display module, further comprising combining the display module with the lower substrate, at the upper surface of the lower substrate.

17. The method of claim 11, wherein the providing the plurality of grooves comprises defining a depth of each of the plurality of grooves which is equal to or smaller than half of a thickness of the lower substrate.

18. The method of claim 11, wherein the lower substrate comprises a plurality of opening groups arranged in the first direction, each of the plurality of opening groups comprises a plurality of openings defined therethrough, and the plurality of support bars are disposed between the plurality of opening groups when viewed in a plane.

19. The method of claim 11, further comprising bonding the first portion of each of the plurality of support bars with the lower substrate.

20. The method of claim 19, wherein the bonding of the first portion of the plurality of support bars to the lower substrate comprises:

providing an adhesive member between the first portion and the lower substrate; and thermally-bonding the first portion of the plurality of support bars with the lower substrate, via the adhesive member.

\* \* \* \* \*